United States Patent [19]

Nelson

[11] 4,053,832
[45] Oct. 11, 1977

[54] A.C. POWER METER

[75] Inventor: Carl T. Nelson, Sunnyvale, Calif.

[73] Assignee: National Semiconductor Corporation, Santa Clara, Calif.

[21] Appl. No.: 689,235

[22] Filed: May 24, 1976

[51] Int. Cl.² ............................................. G01R 21/06
[52] U.S. Cl. ................................ 324/142; 307/220 R; 364/483
[58] Field of Search ................... 324/142; 307/220 R; 235/194, 151.31; 340/310 A

[56] References Cited
U.S. PATENT DOCUMENTS

| 3,304,419 | 2/1967 | Huntley, Jr. et al. | 235/194 |
| 3,484,595 | 12/1969 | Krips | 235/194 |
| 3,544,780 | 3/1967 | Jorgensen | 235/194 |
| 3,818,206 | 6/1974 | Brunner et al. | 324/142 X |

Primary Examiner—Stanley T. Krawczewicz
Attorney, Agent, or Firm—Gail W. Woodward; Willis E. Higgins

[57] ABSTRACT

A pair of PNP and a pair of NPN transistors are connected in a balanced self clamping circuit in which the output response is proportional to the product of transistor emitter current and differential base voltage. The circuit is linear and accurate for use in reading true (in-phase) power in an a-c circuit.

6 Claims, 4 Drawing Figures

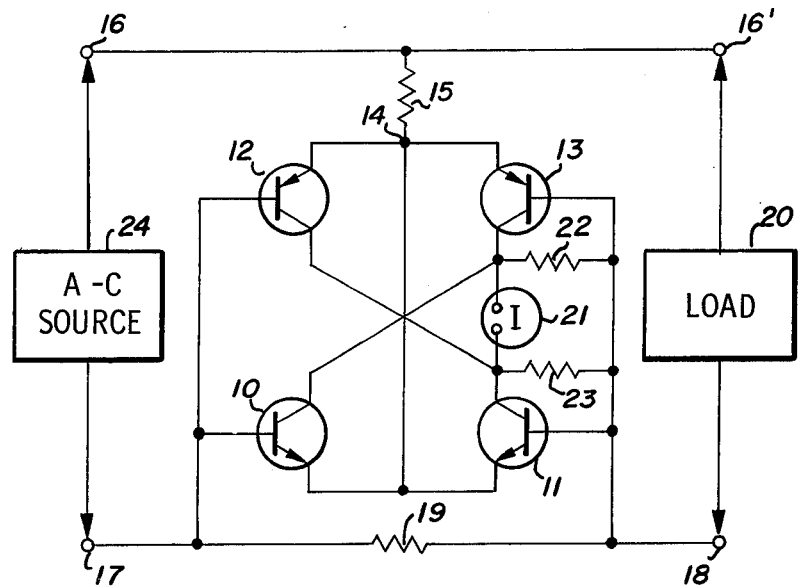
Fig_1
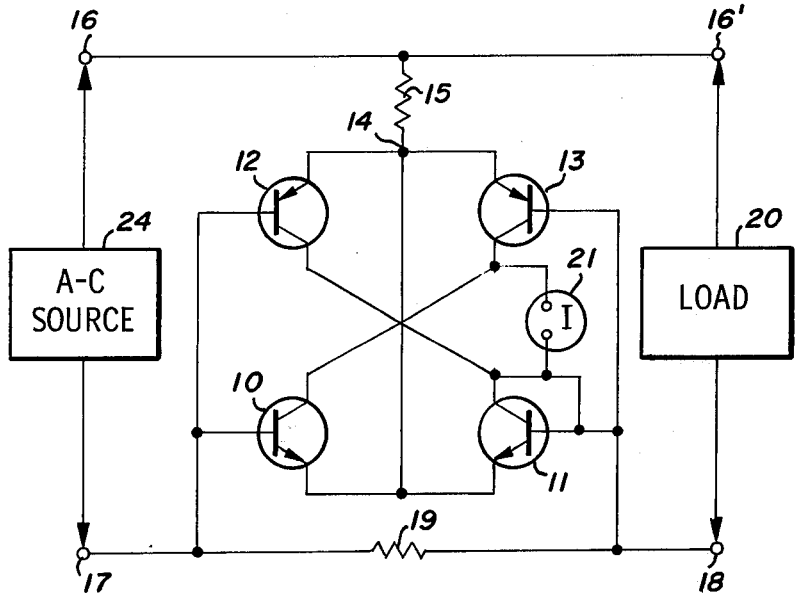
Fig_2

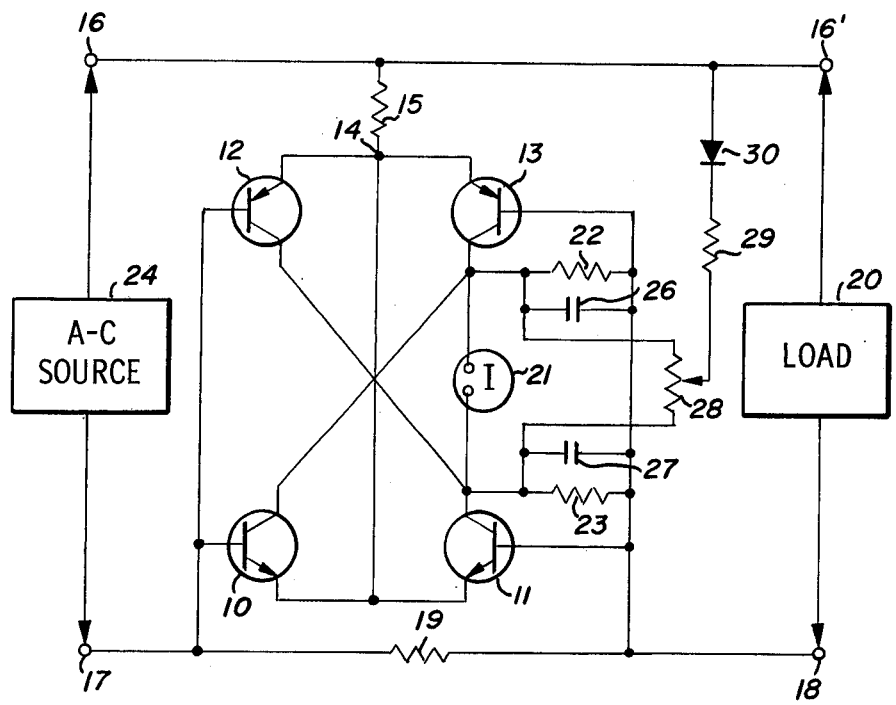
Fig_3
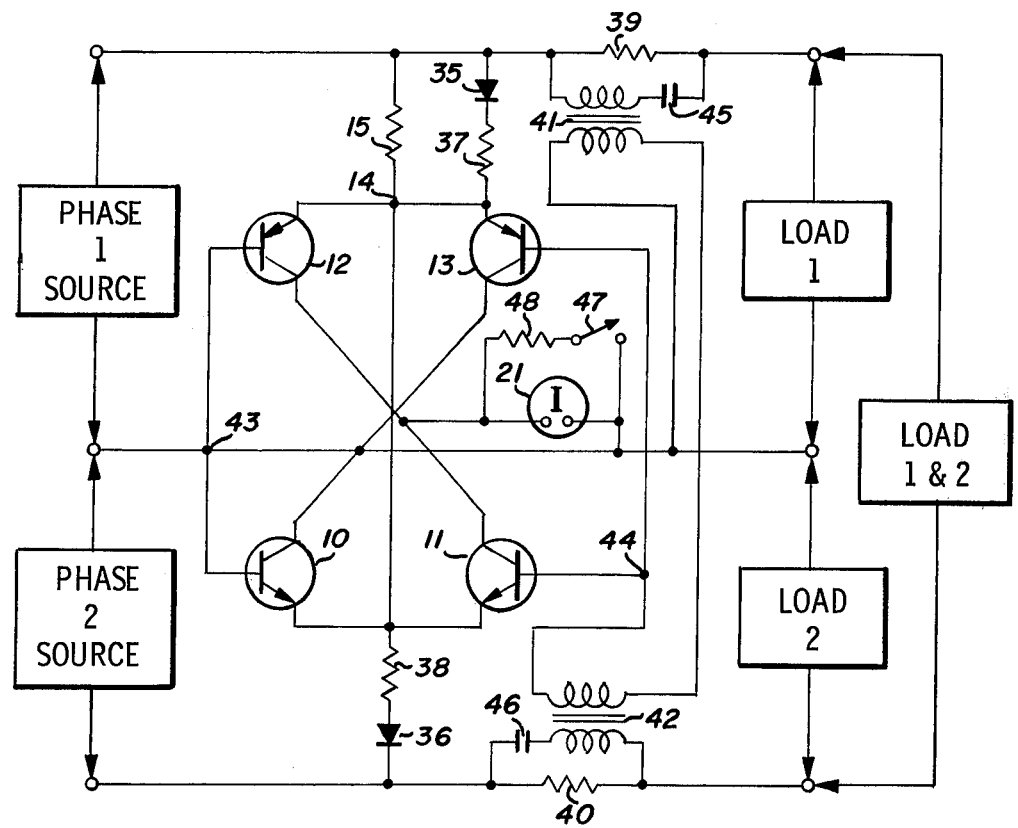
Fig_4

A.C. POWER METER

BACKGROUND OF THE INVENTION

Power meters as well as analog multipliers are well known in the prior art. Typically the prior art circuits require a power supply and are relatively complex.

SUMMARY OF THE INVENTION

It is an object of the invention to provide a multiplication circuit that is self balancing and is self clamping to limit voltage excursions to a very low value.

It is a feature of the invention that a self balancing and self clamping multiplier circuit can be used for a-c power measurement where the self clamping permits simplified current related voltage sensing and the self balancing permits simplified voltage related current sensing.

These and other objects and features are achieved by combining pairs of complementary transistors wherein the input voltage is clamped by emitter-base forward voltage turn on for both input polarities. The collectors are connected in balanced fashion to a sensing device that responds to the product of the current produced by voltages in excess of the clamping level and the differential transistor base voltage.

BRIEF DESCRIPTION OF THE DRAWING

FIG. 1 is a schematic diagram of a circuit employing the invention;

FIG. 2 is a schematic diagram of an alternative embodiment of the invention;

FIG. 3 is a schematic diagram of an improved circuit employing the invention; and FIG. 4 is a schematic diagram of a two phase circuit employing the invention.

DESCRIPTION OF THE INVENTION

The novel circuit of FIG. 1 employs a pair of NPN transistors 10 and 11, preferably matched, and a pair of PNP transistors 12 and 13, preferably matched. The emitters of all four transistors are connected in common to comprise a circuit current node 14 which is coupled via resistors 15 to line terminal 16. Resistor 15 has a large resistance value so as to become a current source for node 14. The current will be determined by the source 24 voltage at terminal 16 with respect to terminal 17. The transistor bases are returned to terminal 17 either by way of resistor 19 which is of low ohmic value or directly. Thus the circuit responds to input voltage in the form of a current flowing to node 14.

The circuit also responds to the current supplied to load 20 via terminals 16' and 18. Resistor 19 develops a small potential difference between terminals 17 and 18 when current flows through load 20. Resistor 19 is kept small so that the potential between terminals 17 and 18 is low, on the order of 10 millivolts or less. Thus resistors 15 and 19 will be determined in value by the voltage and current values that will be experienced by load 20.

The transistor collectors are cross connected as shown and a current meter 21 connected between the cross connected transistor pairs. The transistor collectors are returned to terminal 18 by way of equal value resistors 22 and 23. These resistors have a value such that the collector to base voltages of transistors 11 and 13 will not exceed about 0.3 volt, thereby avoiding transistor saturation.

If no current flows through resistor 19, a no load condition, the circuit will be balanced. Regardless of input polarity, between terminals 16 and 17, a forward biased emitter base diode will clamp the voltage excursions at node 14 relative to terminal 17 to about 0.6 volt. Any input in excess of this value will appear across resistor 15. The PNP transistors 12 and 13 will conduct on one half of the input cycle, while the NPN transistors 10 and 11 will conduct on the alternate half cycles. Since each transistor collector is returned to terminal 17, substantially equal currents will flow in resistors 22 and 23. As explained above resistor 19 is kept small in value so that there will be little differential transistor base voltage due to collector current flow. In practice the collector currents are made very small relative to the current that will flow in load 20. Thus in the no load state the circuit is balanced and current meter 21 will not detect any current.

Under load conditions a voltage will be developed across resistor 19 and the balanced state will no longer exist. For example on the half cycle when terminal 16 is positive with respect to terminal 17, transistors 12 and 13 will be conductive. Since the base of transistor 12 is negative with respect to the base of transistor 13, transistor 12 will conduct more than transistor 13. Thus current upward through meter 21 will dominate. On the other half cycle, when terminal 16 is negative with respect to terminal 17 transistors 10 and 11 will conduct but transistor 10 will conduct more than transistor 11 because the base of transistor 10 is positive with respect to the base transistor 11. Again current upward through meter 21 dominates. Meter 21 will average the fullwave rectified current difference value and will respond in proportion to the voltage differential across resistor 19.

The response of meter 19 will be directly proportional to the product of the voltage across resistor 19 and the current in node 14. This will hold true so long as the voltage across resistor 19 is small, for example less than a few tens of millivolts. For very small values of voltage (less than 10 millivolts) the multiplier response is quite precise. The error up to about 10 millivolts across resistor 19 is less than 1%.

In the application of FIG. 1 the voltage across resistor 19 is developed by the current in load 20 and the current at node 14 is set by the voltage across load 20. The meter will respond to the power in load 20. The response will be in accordance with the relation:

$$E \pm I \pm \text{Cosine } \phi$$

where $\phi$ is the phase angle between the voltage and the current. This is the true dissipated power. This occurs because, if the current and voltage are out of phase, the currents flowing in meter 21 when averaged tend to cancel. At a 90° phase angle, the meter will read zero even though substantial current flows in load 20. At 180°, the condition where the source and load are exchaged, the meter will read backwards or reverse current.

FIG. 2 shows an alternative embodiment in which the meter resistors are eliminated. The circuit numerals are the same and the performance is similar. Although appearing to be unbalanced, due to transistor behavior, the balanced operation will develop. Since as was described above, the transistor base to emitter voltage will be self clamped at about 0.6 volt. Transistor 11 action will be linear even though the collector is directly connected to the base. In fact the transistor will function linearly until its collector drops to about 0.3 volt above the emitter. Thus the only real constraint of FIG. 2 is that meter 21 introduce less than 0.3 volt drop at full scale current.

While it is preferred that extremely well matched transistor pairs be employed this can prove to be difficult and expensive. If desired, some mismatch compensation can be applied to FIGS. 1 and 2. Although not illustrated, a simple way of doing this is to replace the connection shown between node 14 and the emitters of transistors 10 and 11 with a potentiometer body and the lower end of resistor 15 connected to the arm of the potentiometer which then becomes a zero adjuster.

FIG. 3 shows another alternative embodiment with capacitor bypassing. The circuit is similar to that of FIG. 1 except for capacitors 26 and 27. These capacitors are large enough to bypass resistors 22 and 23 for a.c. signals. This permits using large resistor values for 22 and 23 while keeping the base to collector voltages at less than 0.3 volt. This means less meter shunting and greater meter sensitivity. Furthermore this permits a simple zero adjusting circuit comprising potentiometer 28, resistor 29, and diode 30.

The following set of components resulted in excellent performance for the FIG. 3 circuit:

Transistors 10, 11 — NPN (National LM-194)
Transistors 12, 13 — PNP (2N4020)
Resistor 15 — 150k ohms (for 120v R.M.S. operation)
Resistor 19 — 0.007 ohm (for 1 ampere R.M.S. operation)
Meter 21 — 50 microamperes full scale
Resistors 22, 23 — 100k ohms
Capacitors 26, 27 — 10 microfarads (for 60 Hz operation)
Potentiometer 28 — 100K ohms
Resistor 29 — 10 M ohms
Diode 30 — General purpose 200 volt silicon diode For the values given the power rating is 120 watts but this can be changed by using other values of resistor 19 and/or resistor 15. The transistors listed are selected for low parasitic resistance and therefore accurate performance.

FIG. 4 shows how the multiplier circuit can be used to measure power in a two-phase circuit where loads can be imposed on each phase and across both phases. Transistors 10 – 14 are as was shown previously and the node 14 current established by resistor 15 in conjunction with the voltage on phase 1. Diodes 35 and 36 along with resistors 37 and 38 make the circuit responsive to differential phase voltage. Since two phases are involved, two current resistors 39 and 40 develop voltages proportional to load currents. Transformers 41 and 42 are connected to add the voltges developed across resistors 39 and 40 and apply the sum as a differential voltage between nodes 43 and 44. Capacitors 45 and 46 decouple transformers 41 and 42 for d. c. and thereby avoid saturation effects for d - c load conditions. Also shown is a switch 47 and resistor 48 which gives the meter 21 a two-range capability.

The multiplier has been shown and several power meter embodiments detailed. Clearly there are further modifications and equivalents that would occur to a person skilled in the art. Accordingly it is intended that my invention be limited only by the following claims.

I claim:

1. A multiplier circuit comprising:
First and second PNP transistors and first and second NPN transistors, each of said trainsistors having emitter, base, and collector electrodes,
means coupling the emitters of all of said transistors to a first terminal,
means coupling the collectors of said first NPN and said second PNP transistors together,
means coupling said coupled first NPN and second PNP collectors to a second terminal,
means coupling the collectors of said second NPN and said first PNP transistors together,
means coupling said coupled second NPN and first PNP collectors to said second terminal,
means coupling the bases of said second PNP and NPN transistors together and to said second terminal,
means coupling the bases of said first NPN and PNP transistors together and to a third terminal, and
means for sensing the difference in value between the combined currents of said first NPN and said second PNP transistors and the combined currents of said second NPN and said first PNP transistors whereby said means for sensing responds to the product of the current flowing in combined transistor emitters and the voltage difference existing between the coupled bases of said first NPN and PNP transistors and the coupled bases of said second NPN and PNP transistors.

2. The circuit of claim 1 wherein said means for coupling said coupled collectors includes a first resistor connected between the coupled collectors of said first NPN and said second PNP transistor and said second terminal, a second resistor connected between the coupled collectors of said second NPN and said first PNP transistors and said second terminal, and said means for sensing comprises a current indicator coupled across the resistor terminals not connected to said second terminal.

3. The circuit of claim 2 wherein an alternating voltage is applied to said circuit and wherein said first and said second resistors are each provided with a parallel connected capacitor, the value of said capacitor being selected to provide signal bypass action at the frequency of said alternating voltage.

4. The circuit of claim 1 wherein said collectors of said first PNP and said second NPN and the bases of said second PNP and NPN transistors are coupled to said second terminal and said means for sensing comprises a current indicator coupled between said first NPN and second PNP collectors and said second terminal.

5. The circuit of claim 1 wherein said circuit is coupled in series with a first resistor across the elements of a transmission line, said resistor being coupled to said emitters, said second and said third terminals are coupled together by a second resistor and are coupled in series with one element of said transmission line whereby said means for sensing responds to the real power delivered by said transmission line to a load coupled thereto.

6. The circuit of claim 5 wherein said first resistor has a value that is great with repect to the resistance of said load and said second resistor has a value that is small with respect to the resistance of said load.

* * * * *